United States Patent [19]

Underhill

[11] 4,020,422
[45] Apr. 26, 1977

[54] PHASE AND/OR FREQUENCY COMPARATORS

[75] Inventor: Michael James Underhill, Crawley, England

[73] Assignee: U.S. Philips Corporation, New York, N.Y.

[22] Filed: Sept. 16, 1975

[21] Appl. No.: 613,814

[30] Foreign Application Priority Data

Sept. 26, 1974 United Kingdom ............. 41904/74

[52] U.S. Cl. .............................. 328/133; 307/232; 307/216
[51] Int. Cl.² .............................. H03B 3/04
[58] Field of Search ................ 307/232, 233, 216; 328/133, 134; 329/104

[56] References Cited
UNITED STATES PATENTS

| | | | |
|---|---|---|---|
| 3,501,701 | 3/1970 | Reid | 328/134 |
| 3,599,102 | 8/1971 | Mous | 328/133 |
| 3,671,876 | 6/1972 | Oshiro | 328/134 |
| 3,710,140 | 1/1973 | Volmerange | 328/133 |
| 3,714,463 | 1/1973 | Laune | 307/232 |
| 3,723,889 | 3/1973 | Oberst | 328/134 |
| 3,735,324 | 5/1973 | Phillips | 328/133 |
| 3,755,747 | 8/1973 | Letosky | 307/232 X |
| 3,866,133 | 2/1975 | Debloois et al. | 329/104 |

Primary Examiner—John S. Heyman
Attorney, Agent, or Firm—Frank R. Trifari; George B. Berka

[57] ABSTRACT

A phase comparator indicating a phase difference range of $n \times 360°$, between two input signals, comprising edge triggered shift registers, for dividing the input signals by $n$, means for modulating the width of the resulting output pulses in proportion to the phase difference of the input signals, and integrating means to combine the modulated pulses into a time-averaged signal which is indicative of the phase difference.

8 Claims, 15 Drawing Figures

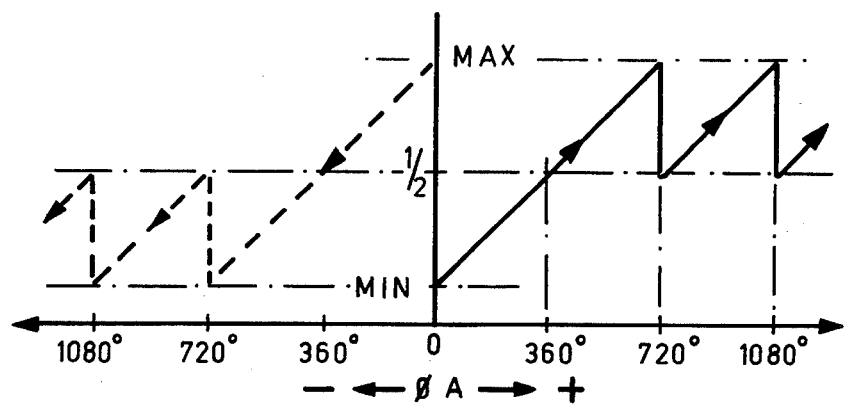
Fig. 13
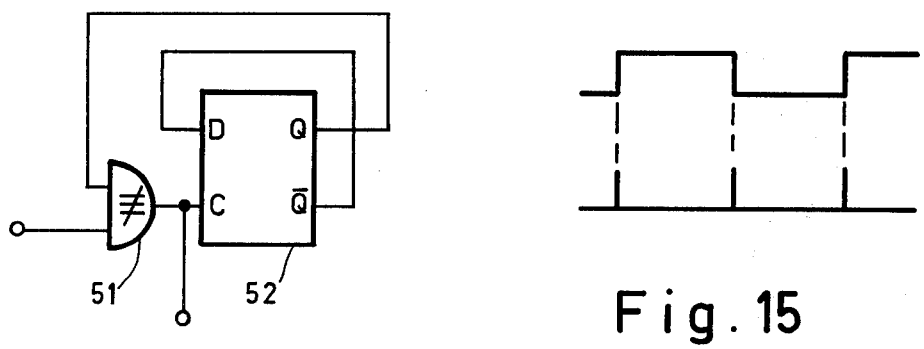
Fig. 14
Fig. 15

PHASE AND/OR FREQUENCY COMPARATORS

This invention relates to a method and apparatus for determining the phase and/or frequency difference between first and second signals by comparing the relative instants of recurrence of a predetermined portion of the waveform of one of the signals with the instants of occurrence of a predetermined portion of the other signal waveform. If the signals are, for example, a.c. signals, the predetermined portions thereof may be the positive-going or negative-going zero crossings. Alternatively, the predetermined portion may be a rising or falling edge of either a digital or analogue signal.

Such a method and apparatus is known and is used, for example, in so-called phase lock loop systems. In such systems, one of the two signals is a reference signal and the other signal is the output signal of a voltage or current controlled oscillator (VCO) the phase and frequency of which has to be locked on to the phase and frequency of the reference signal. The two signals are fed to respective inputs of a phase comparator which is arranged to provide, usually via a low-pass filter or integrator, an analogue output signal whose magnitude is dependent upon the phase and/or frequency difference between the two input signals. This output signal is then used to control the frequency and phase of the VCO output signal in such a manner that the VCO output signal is locked on to the reference signal.

A phase comparator is known in which a set-reset flip-flop is set by each predetermined portion of one of the two signals, and is reset by each predetermined portion of the other of the two signals. The output of the flip-flop is integrated by a low-pass filter. Thus the output of the filter is zero when the two signals are in phase and progressively approaches a maximum level as the phase difference between the two signals approaches 360°. Thus the linear range of such a phase comparator is 360° or $2\pi$ radians.

The range of the phase comparator could, of course, readily be extended to, for example, 720° or $4\pi$ radians by halving the frequency of each signal before applying it to the comparator. This, however, gives rise to two disadvantages. Firstly, the cut-off frequency of the low-pass filter has to be lowered in order to remove ripple frequencies at one half the input frequencies. Secondly, the frequency division process can produce additional unwanted frequency products if either or both input signals have transient phase shifts.

The object of the invention is to provide a method and apparatus which at least considerably mitigates one or both these disadvantages.

According to one aspect of the invention there is provided apparatus for determining the phase difference between first and second input signals, each having a cyclically repetitive waveform, over a phase difference range of $n \times 360°$ wheren $n$ is an integer greater than one; the apparatus including a sequence of $n$ phase comparators each responsive to a respective one of $n$ consecutive waveforms of each of the two signals to provide an output signal representative of the phase difference between the two respective waveforms and signal combining means which combines the said output signal of the comparators and provides a combined signal whose magnitude is dependent upon the phase difference between the two input signals.

According to a further aspect of the invention, there is provided apparatus for determining the phase difference between first and second input signals, each having a cyclically repetitive waveform, over a phase difference range of $n \times 360°$ wheren $n$ is an integer greater than one; the apparatus including first and second circuit inputs for the first and second signals respectively; first and second pulse distributors respectively connected to the first and second circuit inputs, each distributor being arranged to provide a respective output pulse on each of $n$ outputs thereof in turn in dependence upon the instants of arrival of a predetermined portion of each of $n$ consecutive waveforms of the input signal concerned; $n$ phase comparatos each connected to a respective corresponding output of each of the two distributors, each phase comparator being arranged to provide an output signal representative of the phase difference between pulses appearing on the distributor outputs to which it is connected; and signal-combining means connected to the outputs of the phase comparators for combining output signals appearing thereon to provide a combined signal having a magnitude proportional to the phase difference between the two said input signals.

According to yet a further aspect of the invention, there is provided a method for determining the phase difference between first and second signals, each having a cyclically recurring waveform, over a phase difference range of $n \times 360°$ where $n$ is an integer greater than one, the method comprising the steps of dividing the first and second signals into respective first and second signal groups each of $n$ consecutive waveforms, sequentially determining the phase difference between each of the $n$ waveforms of a first signal group and the correspondingly-positioned waveform in a second signal group, deriving for each respective waveform of the first and second signal groups an output signal proportional to the phase difference between the two waveforms concerned, and combining the derived output signals to provide an output signal having a signal level proportional to the phase difference between said first and second signals.

The features and advantages of the invention will be apparent from the following description of embodiments thereof, taken by way of example, with reference to the accompanying drawings, of which:

FIG. 1 shows a block schematic circuit diagram of a first embodiment of a phase comparator according to the invention, FIG. 2 shows waveforms of signals occurring in the circuit of FIG. 1, FIG. 3 shows a circuit for an edge triggered set-reset flip-flop constructed from edge-triggered delay flip-flops and logic gates, FIG. 4 shows a block schematic circuit of a second embodiment according to the invention, FIGS. 5 and 6 show circuit waveforms relevant to the circuit of FIG. 4, FIG. 7 shows a block schematic circuit of a third embodiment, FIG. 8 shows a block schematic circuit of a fourth embodiment of a phase comparator according to the invention which also acts as a frequency comparator.

FIGS. 9 to 13 show waveforms relevant to the circuit of FIG. 8, and

FIGS. 14 and 15 show an example of a frequency doubler and the associated waveforms, respectively, suitable for use with a phase comparator according to the invention.

In the following description, it will be assumed for convenience that the two input signals are binary logic signals having logic levels "0" and "1" and that the leading edge of each waveform goes from "0" to "1". As is well known in the art, such signals may readily be produced from input analogue signals by the use of, for example, Schmitt trigger circuits.

Figure 1:
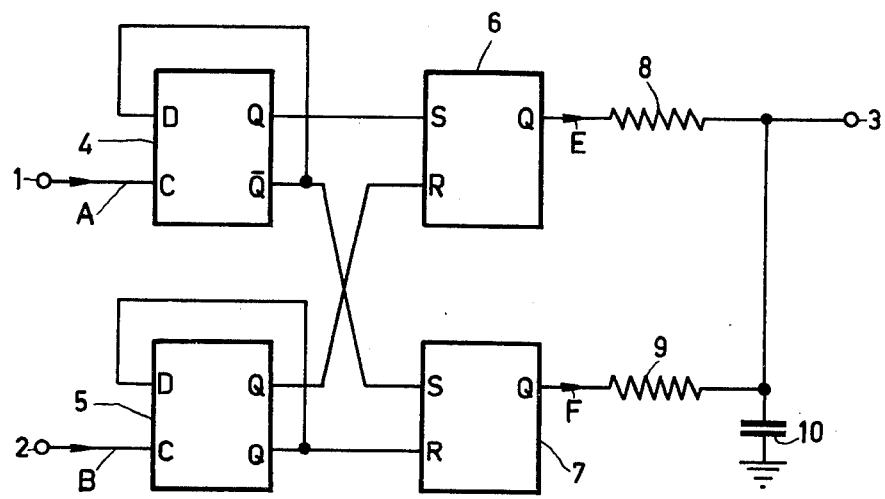

Referring now to FIG. 1, the comparator shown comprises two input terminals 1 and 2, an output terminal 3, two divide-by-two circuits 4 and 5 each comprising an edge-triggered delay flip-flop having clock and delay inputs C and D respectively and complementary outputs Q and $\overline{Q}$, two edge-triggered set-reset flip-flops 6 and 7 each having set and reset inputs S and R respectively, and an output Q, two resistors 8 and 9, and a capacitor 10 having one terminal connected to a point of fixed potential such as ground. The signals to be compared are fed to inputs 1 and 2 respectively.

Each divide-by-two circuits 4 and 5 is a delay flip-flop which acts as a divide-by-two circuit due to the feed-back connection from its $\overline{Q}$ output to its D input.

The first leading edge of a signal at terminal 1 sets flip-flop 6, the second leading edge sets flip-flop 7. The first leading edge of a signal at terminal 2 resets flip-flip 6 and the second leading edge resets flip-flop 7. Thus if the two input signals are in phase, the Q outputs of flip-flops 6 and 7 are zero since neither flip-flop is set.

Figure 2:
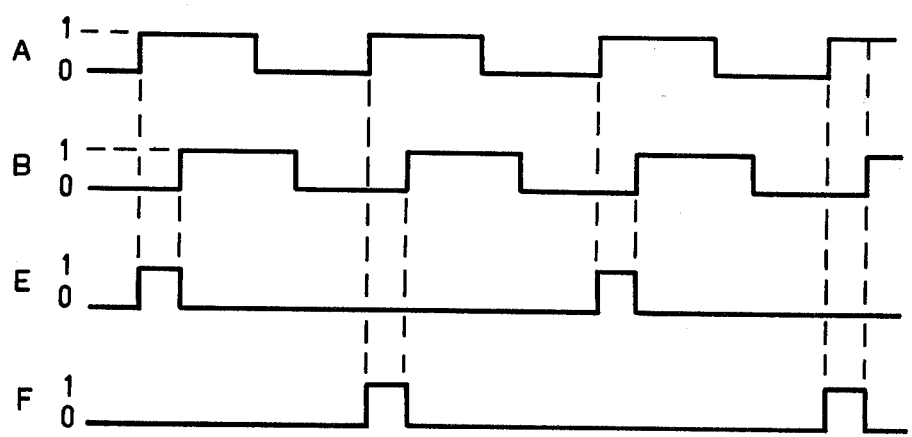

In the following description, the phase change between the signals on terminal 1 (signal A) and terminal 2 (signal B) will be referred to as positive when the leading edges of signal A are in advance of those of signal B. FIG. 2 shows input signals A and B and the output signals E (at the Q output of flip-flop 6) and F (at the Q output flip-flop 7) with a positive phase difference of 60°. From this Figure, it can be seen that the waveforms of signals E and F have the same characteristic shape, have half the frequency of the input signals, and are out of phase with each other by 360° ($2\pi$ radians) with respect to the input signal A.

As the phase difference becomes progressively more positive, the duration of the "1" level in each output signal increases proportionally and approaches the level "1" as the phase difference approaches 720° ($4\pi$ radians). When it reaches 720° (equivalent to 0° in this case) the output drops to zero again and the cycle is repeated.

It can be appreciated that with 360° phase difference between signals A and B, signals E and F each have a one-to-one mark-space ratio's and are complementary. Thus any residual ripple that would appear on output 3 (due to the filter characteristic) from one of the signals E and F would be equal and opposite to that from the other signal. Thus there is no ripple in the output at 360° phase difference provided that resistors 8 and 9 are equal or (in the event of slight differences in the nominally symmetrical circuits) are balanced. As the phase difference departs from 360° (the centre of the linear output range) so the mark-space ratios of signals E and F change and there is no longer complete cancellation of the two ripples. Nonetheless, a very significant reduction in ripple amplitude at output 3 is achieved as compared with a system in which the input frequencies are divided by two and operate a single set-reset flip-flop.

Figure 3:
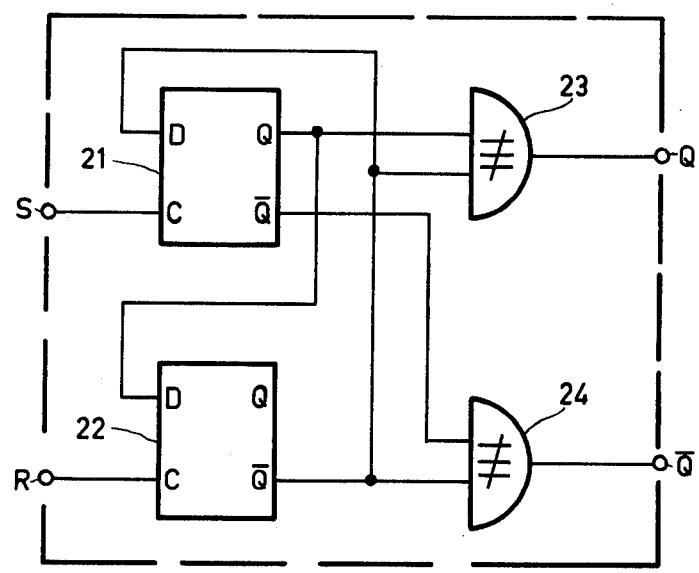

FIG. 3 shows, by way of example, an edge-triggered set-reset flip-flop comprising two delay flip-flops 21, 22 and two EXCLUSIVE-OR gates 23, 24. This circuit can be used for each of flip-flops 6 and 7, in FIG. 1, in which case six delay flip-flops and four gates are used. The circuit can thus be readily built in integrated circuit form using for example, from three "Dual D-type Flip-Flops" Type FJJ131 and one "Quad 2-input Exclusive-OR" Type FJH271, these TTL integrated circuits being available from Mullard Limited. If the $\overline{Q}$ output of the set-reset flip-flop shown in FIG. 3 is not required (as is the case of FIG. 1), the two gates 24 need not be provided, of course.

The way in which the invention eliminates the production of additional unwanted frequency products resulting from the division process in the event of phase modulation (e.g. jitter) in the original signals will now be explained in terms of a specific example. Assume that a clock pulse has a pulse repetition frequency of 1 MHz and that, for some reason or other, every fourth pulse is missing. Then a jitter would occur every 4 microseconds, representing a frequency component in the clock pulse signal of 250 kHz. Fourier analysis, of course, shows that the signal has no frequency components lower than 250 kHz. If the clock signal were fed to a divide-by-two circuit, the output pulses would show the jitter once every eight microseconds and, hence, a frequency component of 125 kHz would be present in the output signal. Thus, the divide-by-two process produce an unwanted frequency intermodulation product.

The apparatus and method according to the invention, however, do not produce this unwanted frequency even though divide-by-two circuits are used. Assuming that one of the input signals of FIG. 1 is the clock pulse referred to above, each set-reset flip-flop produces a jitter every eight microseconds. The two set-reset flip-flops, however, operate alternately so that the jitters in the output of one of the flip-flops are interspersed by the jitters in the other. The two series of jitters are combined in the output and, hence represent the original jitter frequency of 250 kHz.

Figure 4:
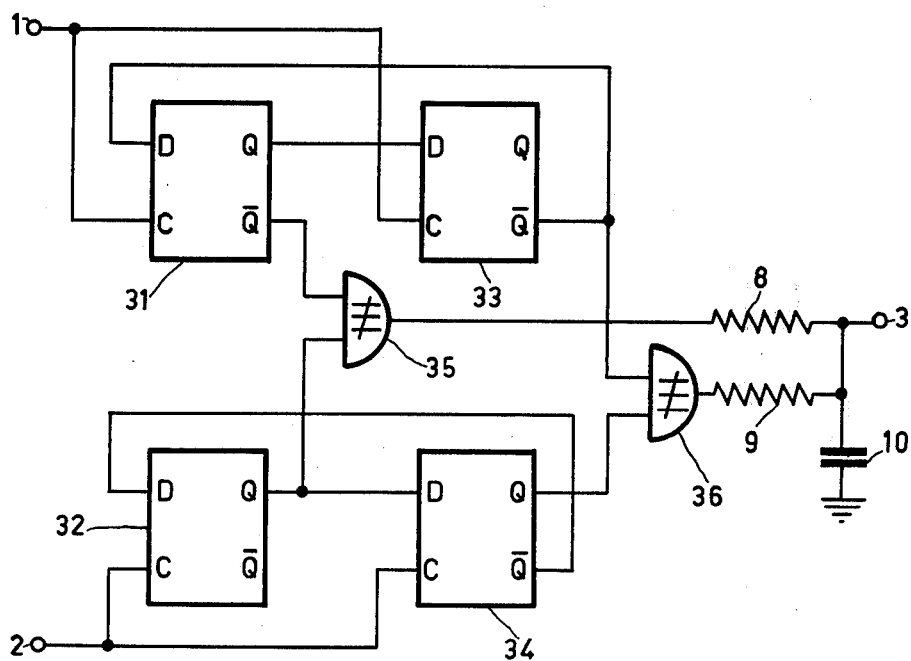
Figure 5:
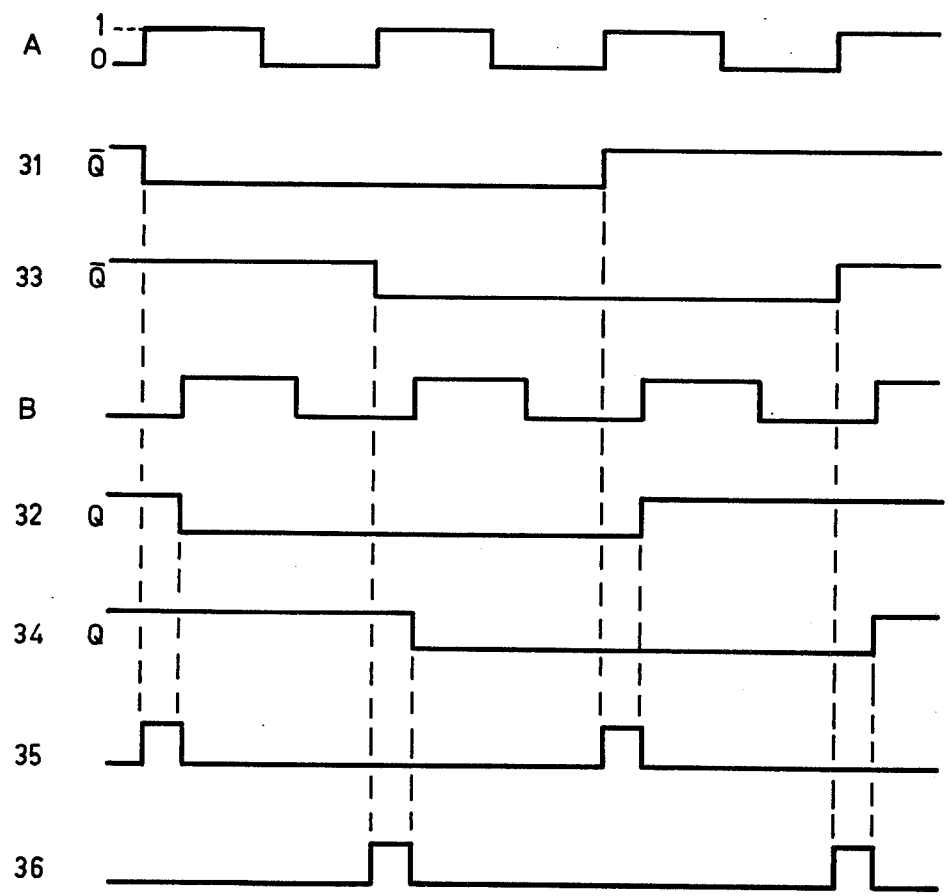

The circuit of FIG. 1, using the circuit of FIG. 2, may be simplified by combining the divide-by-two and the set-reset functions. Such a simplified circuit is shown in FIG. 4 in which items which are the same as in FIG. 1 are given the same reference numerals. Flip-flops 4 to 7 of FIG. 1 are now replaced by four delay flip-flops 31-34 and two EXCLUSIVE-OR gates 35 and 36. FIG. 5 shows the operation of the circuit in terms of signal waveforms appearing at various points in the circuit with input signals A and B fed to input terminals 2 and 1 respectively; the signals again having a positive phase difference of 60°. The other waveforms are each referenced by the reference numeral of the component which provides the waveform concerned at its output followed by, when applicable, the reference letter of the particular output thereof at which the signal appears. Thus 31$\overline{Q}$ refers to the signal at output $\overline{Q}$ of flip-flop 31, and 35 refers to the output signal of gate 35.

Figure 6:
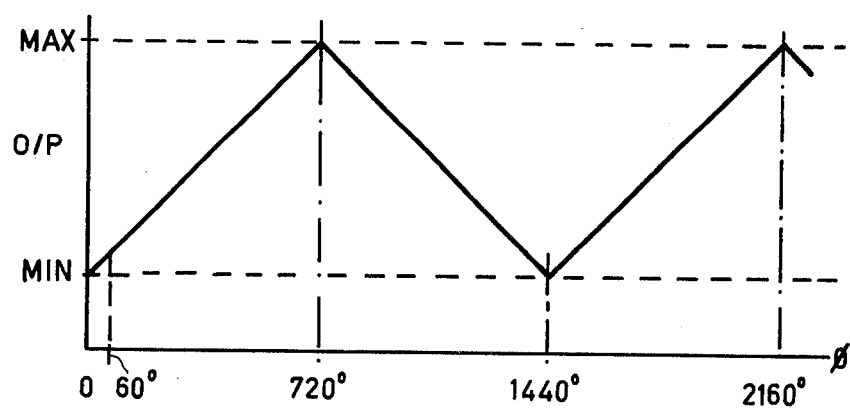

It can readily be appreciated that as the phase difference increases positively, so the pulse width of the pulses 35 and 36 increases until, at 720° phase difference, both outputs are permanent "ones". As the phase difference increases positively beyond 720° so the output pulse width reduces; finally reaching zero again at 1440° ($8\pi$ radians). The two pulse trains 35 and 36 are combined and integrated by resistors 8, 9 and capacitor 10, and the analogue output appearing at terminal 3 is shown in FIG. 6, which shows the output level at terminal 3 for a positively-increasing phase difference $\phi$. The point on the curve corresponding to the 60° positive phase difference of FIG. 5 is also shown in FIG. 6.

As can be seen from FIGS. 2 and 5, the ripple frequency at output 3 is the same as the input signal frequency and, therefore, the cut-off frequency of the filter unit formed by resistors 8, 9 and capacitor 10 does not have to be halved as in previously-known divide-by-two type phase comparators.

Figure 7:
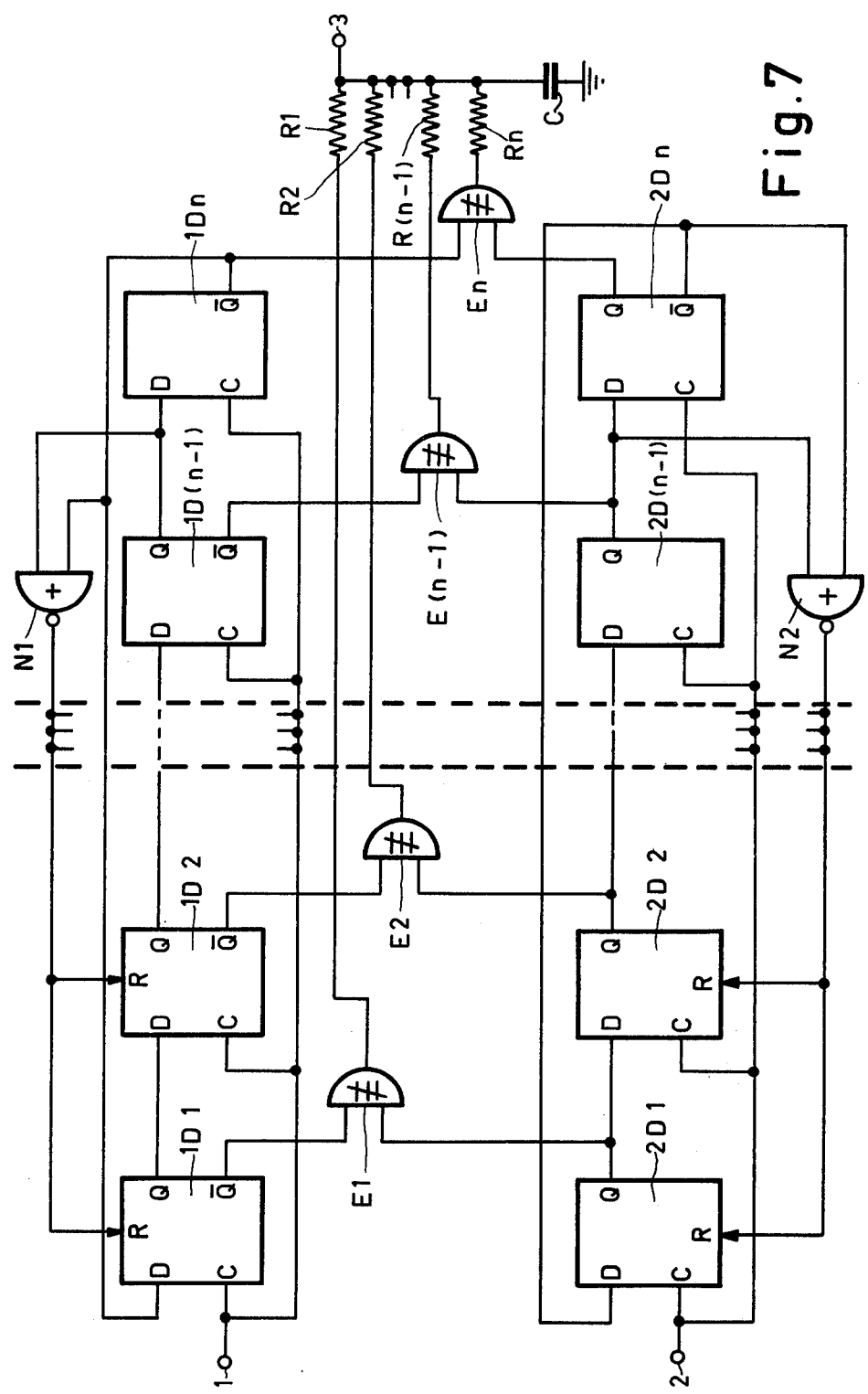

The basic method and apparatus, so far described with reference to FIGS. 1 to 6 can readily be extended to provide an $n$-times extension of the linear range where $n$ is any positive integer greater than 1. It can be seen from FIGS. 1 and 2 that flip-flops 6 and 7 are respectively set by alternate leading edges of signal A. Thus each of divide-by-two circuits 4 and 5 may be replaced, for example, by a two-stage recirculating dynamic shift register clocked by the respective input signal A and B and having a single "1" recirculating in it. It will be obvious that if $n$ stages are provided in such a shift register and if each stage has an associated set-reset flip-flop then a phase comparator is provided which has a linear range extending over a phase difference of 360$n$°. Such a polycyclic phase comparator may readily be provided, for example, by extending the comparator shown in FIG. 4 with more stages each comprising a pair of D-type flip-flops and an EXCLUSIVE-OR gate. A generalized case, having $n$ stages, is shown in FIG. 7 in which each stage comprises a pair of D-type flip-flops 1D and 2D, and EXCLUSIVE-OR gate E, and an output resistor R. The relevant stage number of each component is given by a suffice 1 to $n$ added to each component reference. Four stages are shown in the Figure, other intermediate stages being indicated by the broken lines. The circuit is further provided with input terminals 1 and 2, an output terminal 3 to which an integrating capacitor C is connected, and two NOR-gates N1 and N2. Although FIG. 7 shows four or more stages, a 3-stage comparator may be provided by omitting the second stage and gates N1, N2.

Comparison of FIG. 7 with FIG. 4 shows that the former is a simple extension of the latter; the D input to each first stage being connected to the $\overline{Q}$ output of the corresponding last stage. In both cases, each chain of flip-flops forms a Johnson ring counter clocked by the respective input signal appearing at terminal 1 or 2. In such a counter, with all stages initially having $Q = "0"$, the stages are progressively switched to the $Q = "1"$ stage due to the output of the last stage being inverted (by using the $\overline{Q}$ output in this case) and fed to the D input of the first stage. When the last stage goes to $Q = "1"$, the next clock pulse causes the first stage to go to "0" and successive clock pulses then fill all remaining stages with "0". Thus the circuit divides by 2$n$ where $n$ is the number of stages. If such a counter has four or more stages some difficulty is initially experienced on switching on the power supply due to the fact that the respective stages are filled with "1" or "0" in an arbitrary manner. This is overcome by the two NOR gates N1 and N2 in the following manner. If the penultimate stage is at "0" and the last stage is at "1", then, in the Johnson code, all other stages should be at "0". When this particular condition of the last two stages is reached, NOR-gate N1 (or N2) is enabled and gives a "1" output. The output of gate N1 (N2) is connected to the respective reset inputs R of all but the last two stages so that, when the output of gate N1 goes to "1", these stages are reset to $Q = "0"$. There are, of course, several alternative ways of ensuring that the counter is rapidly set to a Johnson code on being initially switched on. Thus, for example, gate N1 could be replaced by an AND-gate having its inputs connected to the respective Q output of each of the last two stages and its output connected to the set inputs of the remaining stages. In this case, all stages are set to "1" when the last two stages are each at "1".

With signals A and B applied to terminals 1 and 2 respectively, the respective first leading edges of the two signals are compared by gate E1, the second leading edges are compared by gate E2 and so on, the $n$th leading edges being compared by gate E$n$. The ($n$ + 1)th leading edges are, of course compared by gate E1 and the cycle repeats.

With resistors R1 to R$n$ equal or balanced, the output characteristic of the comparator shown in FIG. 7 is of the pyramidal shape shown in FIG. 6 except, of course, that the 720° point becomes $n \times 360°$, the 1440° point becomes $n \times 720°$, and so on.

The circuit of FIG. 1 can be extended in a similar manner, of course, using the D-type flip-flops as part of respective Johnson counters for example. In this case, the output characteristic is a saw-tooth waveform rising from a minimum to a maximum over a phase difference range of 0° to $n \times 360°$, whereafter the cycle repeats.

In each of the polycyclic phase comparators described above, ripple cancellation occurs each time the phase difference is an integer multiple of 360°. Thus for $n$ stages, cancellation occurs at the two extremities of the range and at ($n - 1$) times in between.

Figure 8:
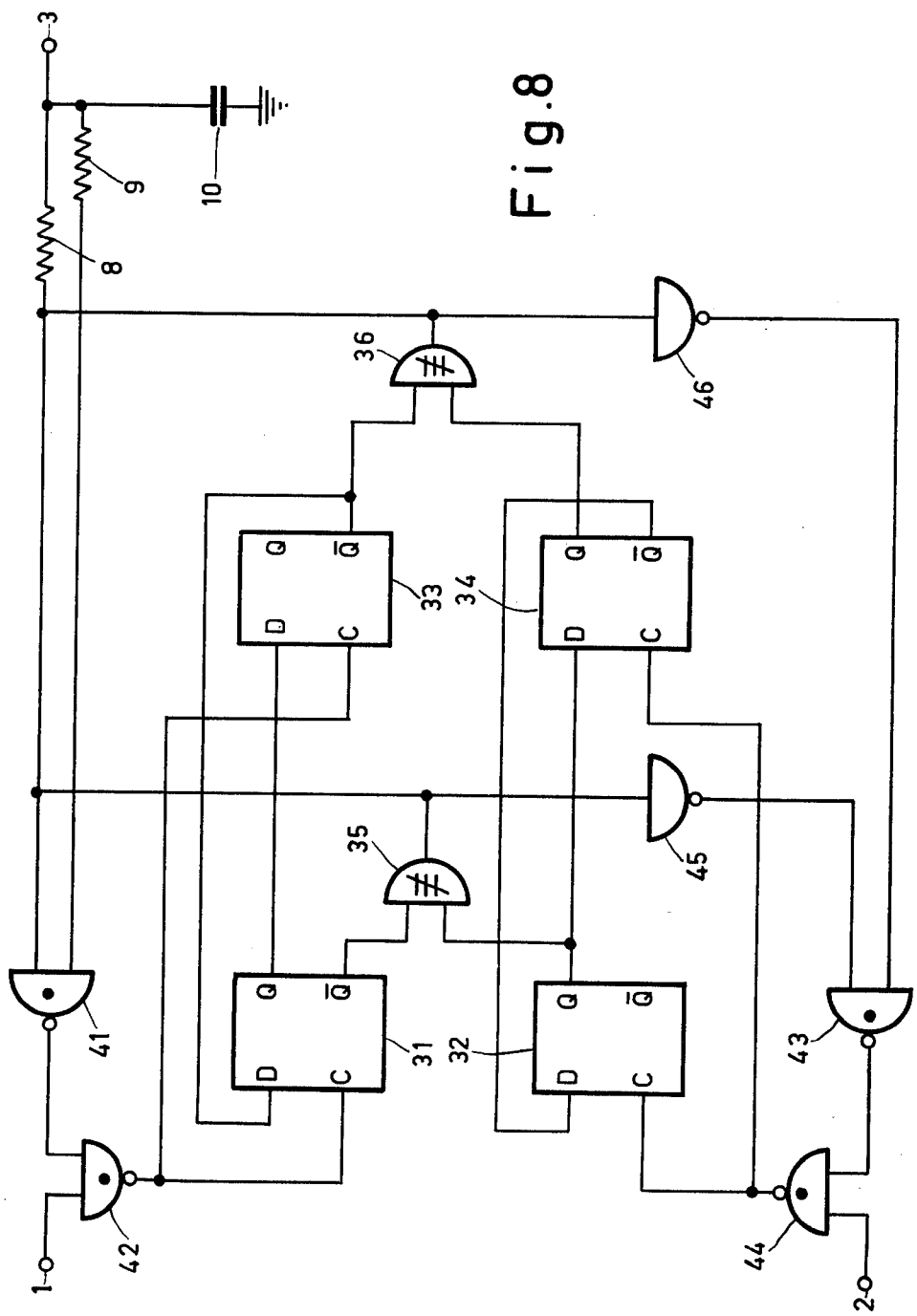

The polycyclic phase comparator so far described may be extended in a simple manner to provide a phase and frequency comparator. An example of a phase and frequency comparator will now be described with reference to FIG. 8 of the drawings, which FIG. shows the phase comparator of FIG. 4 with the addition of four NAND-gates 41–44 and two inverters 45, 46. Corresponding components in FIGS. 4 and 8 are given the same refeence numerals.

NAND-gate 41 holds the output of NAND-gate 42 at level "1" if the outputs of EXCLUSIVE-OR gates 35 and 36 are both "1". NAND-gate 43 holds the output of NAND-gate 44 at level "1" if the outputs of gates 35 and 36 are both "0". For all other combinations of the states of gates 35 and 36 the circuit of FIG. 8 functions in the same manner as FIG. 4 over the 720° range except, of course, that the flip-flops now respond to the trailing edges of the signals at terminals 1 and 2 due to the inverting of these signals by gates 42 and 44 respectively. The operation of the circuit of FIG. 8 will now be further described with reference to the waveforms given in FIGS. 9 to 12, each of which FIGS. shows input waveforms A and B appearing at inputs 1 and 2 respectively. The remaining waveforms in each of the Figures are those appearing at the output of the circuit element bearing the same reference numeral.

Figure 9:
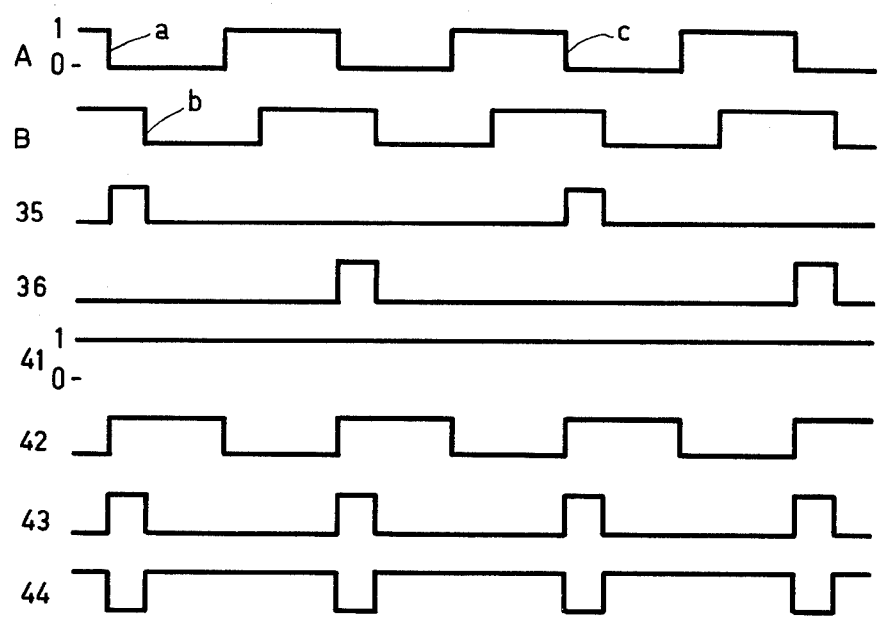

FIG. 9 shows the various waveforms with a positive phase difference between signals A and B of 60°; i.e. the trailing edge $a$ of signal A occurs 60° before trailing edge $b$ of signal B. Waveforms 35 and 36 are the same as in FIG. 5 and the slope of the output signal over the range 0°–720° is the same as in FIG. 6. Since waveforms 35 and 36 are never simultaneously in the "1" state, waveform 41 remains in the "1" state and waveform 42 is the inverse of waveform A. During the periods that waveforms 35 and 36 are both at "0", each input of gate 43 is "1" and the resultant "0" output of gate 43 causes the output of gate 44 to be a "1" irrespective of the signal A. Each time waveform 35 or 36 changes state due to a trailing edge of signal A, waveform 43 goes to "1". Thus at the instant of arrival of trailing edge b of signal B, waveform 43 is at "1" and, hence, gate 44 inverts edge b to provide a clock pulse to flip-flops 32 and 34. Thus the trailing edges of signals A and B are inverted and fed to the respective flip-flops in their correct phase relationships.

Figure 10:
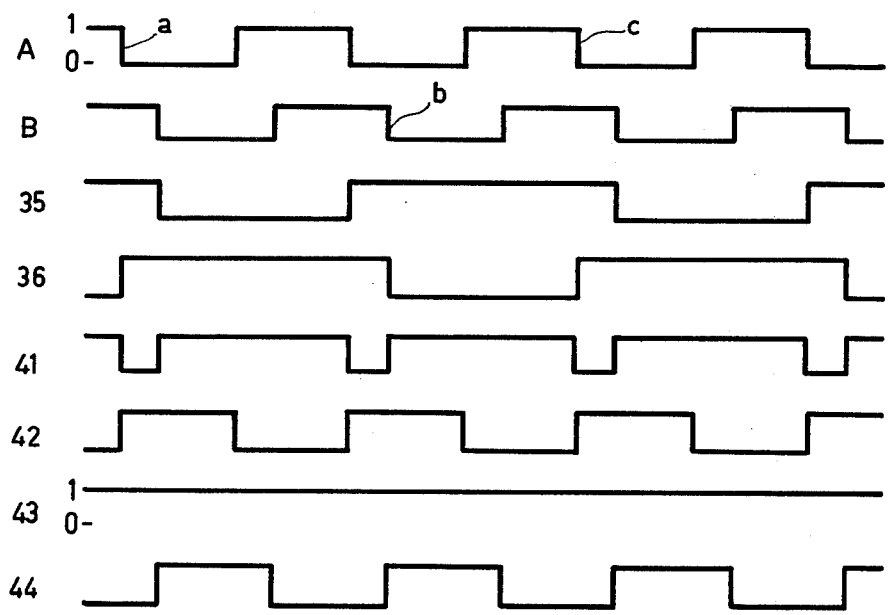

As the phase difference increases in the positive direction, so trailing edge b moves towards the right in FIG. 1 and the width of the pulses in waveform 43 increases until, at 360° phase difference, waveform 43 is permanently in the "1" state. As the phase difference increases beyond 360° so waveform 41 starts pulsing. FIG. 10 shows the same waveforms when the phase difference between trailing edges a and b has increased to 420°. At the instant each trailing edge of signal A arrives, waveform 41 is in the "1" state; so the trailing edges of signals A and B are again inverted and passed to the respective flip-flops in their correct phase relationship. Waveforms 35 and 36 now have a mark-space ratio of 420°/720/ (7/12).

Figure 11:
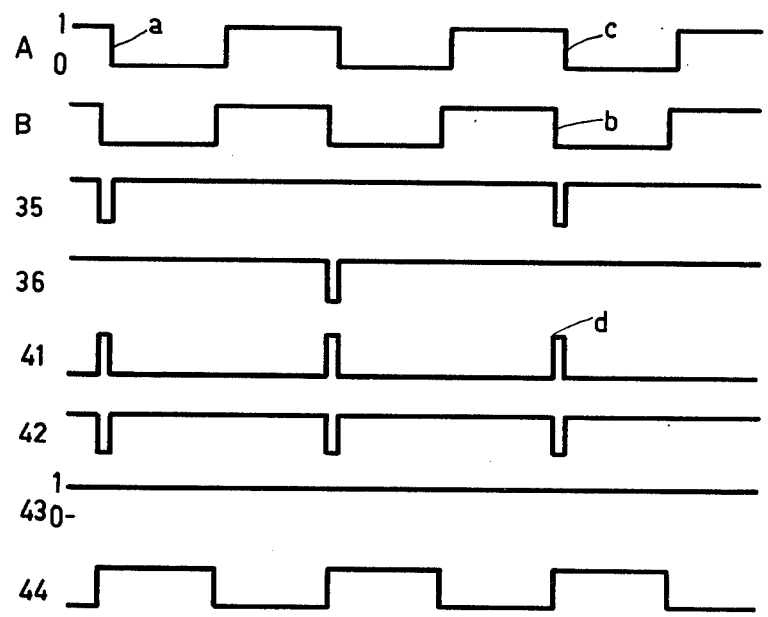

As the phase difference between trailing edges a and b increases towards 720° so the mark-space ratio of waveforms 35 and 36 increases and the mark-space ratio of waveform 41 decreases. FIG. 11 shows the waveforms when the phase difference between trailing edges a and b has increased to just below 720°; trailing edge c of waveform A representing a 720° phase difference. As can be seen, waveforms 35 and 36 are almost at their maximum output level and, when integrated, are represented by a point just below the 720° peak of the 0° − 720° slope of FIG. 6.

Figure 12:
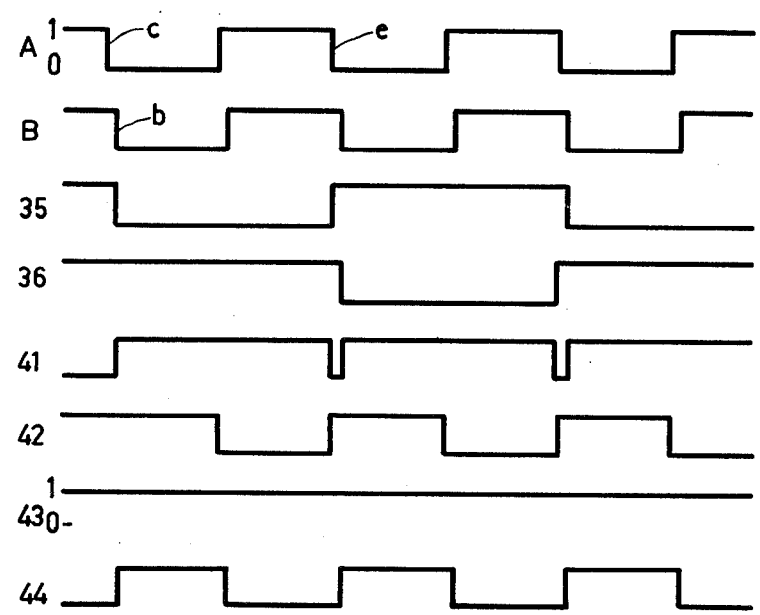

The width of pulse d of waveform 41 in FIG. 11 is defined by the phase difference between trailing edges b and c and this pulse must be present in order for trailing edge c to be inverted and passed as a clock pulse to the respective flip-flops. As the phase difference between signals A and B approaches 720° so the width of pulse d approaches zero and finally disappears when the phase difference is 720°. When this happens, trailing edge c is not passed by gate 42 since pulse d has now disappeared. FIG. 12 shows the situation when the phase difference between signals A and B has increased to slightly beyond 720°, represented in the Figure by trailing edge b now being slightly to the right of trailing edge c. At the instant of arrival of edge c, waveform 41 is "0" and waveform 42 is therefore held at "1". Edge c is therefore not passed on to flip-flops 31 and 33 as a clock pulse and as a result, none of gates 35, 36 and 41 to 44 changes state on arrival of the c edge. Thus in effect, pulse c has been blanked out since it has no effect on the circuit. This effect can readily be appreciated by considering FIG. 12 as being joined on the right hand end of FIG. 11; the phase difference changing from just below to just above 720° at the joining line. The circuit has been conditioned by the arrival of edge c of FIG. 11 to respond to the arrival of a following b edge; so the edge c of FIG. 12 is ignored and, as a result, the operation of flip-flop 31 or 33 is delayed by one period of signal A, and the output at terminal 3 shifts accordingly. Thus the circuit has detected the presence of two trailing edges of signal between two adjacne trailing edges of signal B.

The delay in the operation of flip-flop 31 or 33 causes the operational phase relationship between flip-flops 31, 33 and 32, 34 to change by 360° and this causes the circuit to switch back to a state similar to that shown in FIG. 10. As can be seen from FIG. 12, the mark-space ratio is substantially 1:1, with the result that the output at terminal 3 drops back from its maximum value to a value half way between the maximum and minimum levels.

As the phase difference between signals A and B increases positively from 720° to 1080° so the signal level at terminal 3 increases to maximum again and, at 1080°, again drops to half value whereafter the cycle repeats itself for every 360° increase of phase difference. If the phase difference between signals A and B is changing at a constant rate, this represents a frequency difference between the two signals; each 360° change representing a frequency difference of one cycle. FIG. 13 shows the output level at terminal 3 as the phase $\phi A$ of signal A varies with respect to signal A, from which Figure it can be seen that this output level always lies within the upper half of the level range if the positive phase difference is in excess of 360°. Thus if the frequency of signal A is higher than that of signal B then the circuit output lies within the upper half of its range. The broken line curve shows the output at terminal 3 for a negative phase difference, from which it can be seen that if the frequency of signal A is lower than that of signal B then the circuit output lies within the lower half of the output range. Thus in the event of signals A and B having different frequencies, the circuit provides an indication as to whether the frequency of signal A is higher or lower than the frequency of signal B and this enables very rapid locking of the two signals in a phse lock loop circuit.

If EXCLUSIVE-OR gates 35 and 36 are of the type having Q and $\overline{Q}$ outputs, inverters 45 and 46 are not required; the inputs to gate 43 being taken directly from the $\overline{Q}$ outputs of gates 35 and 36.

It will be obvious to those skilled in the art that the circuit of FIG. 1 can also be modified to provide a phase and frequency comparator in a similar manner to that of FIG. 4. It will also be obvious that circuits having a linear output range over a phase difference of $n \times 360°$ can equally well be modified to provide frequency sensitivity beyond this range using the principle of blanking out a pulse of the higher frequency signal every time that the phase difference between the two signals changes by 360° once the phase difference is greater than $n \times 360°$.

The phase and frequency comparators described above may, of course, be used solely as frequency comparators if required and the actual frequency difference may be determined by counting the number of excursions of the output waveform with respect to time.

Any of the foregoing phase and/or frequency comparators may be made responsive to both edges of the input waveforms by providing each input with an additional circuit which provides a unidirectional pulse for each edge of the input waveform. Such a circuit may comprise, for example, an edge-triggered delay flip-flop 51 and an EXCLUSIVE-OR gate 52 connected as shown in FIG. 14. The input and output waveforms of this circuit are shown in FIG. 15, the width of each output pulse being equal to the combined switching times of flip-flop 51 and gate 52. The provision of such circuits will, of course, halve the phase range of the comparator concerned. Thus, for example, the range of a 720° phase comparator would be reduced to 360° with respect to the input waveform to the edge pulse circuit but, provided that the mark-space ratios of the two input waveforms are substantially the same, there is a substantial reduction in ripple amplitude compared with previously-known phase comparators.

A comparator according to the invention and having a 720° phase difference range was used as a loop phase comparator in a programmable divider type of frequency synthesizer and was found to give a 60 dB ripple suppression compared with the use of a conventional divide-by-two (720°) type of comparator in the synthesizer.

What is claimed is:

1. Apparatus for determining the phase difference between first and second input signals, each having a cyclically repetitive waveform, over a phase difference range of $n \times 360°$ wherein $n$ is an integer greater than one, comprising: a sequence of $n$ phase comparators each responsive to a respective one of $n$ consecutive waveforms of each of the two signals to provide repetitive output pulses having a width representative of the phase difference between the two respective waveforms, and signal combining means which combines the said output pulses of the comparators and provides a combined signal whose time-averaged magnitude is dependent upon the phase difference between the two input signals.

2. Apparatus for determining the phase difference between first and second input signals, each having a cyclically repetitive waveform, over a phase difference range of $n \times 360°$ wherein $n$ is an integer greater than one, comprising: first and second circuit inputs for the first and second signals respectively; first and second pulse distributors respectively connected to the first and second circuits inputs, each distributor being arranged to provide a respective output pulse in response to the instants of arrival of a predetermined portion of each of $n$ consecutive waveforms of the input signal; two pulse width modulators each connected to a respective corresponding output of each of the two distributors, each pulse width modulator being arranged to adjust the width of each output pulse according the phase difference between the two input signals; and signal-combining means connected to the outputs of the pulse width modulators for combining the modulated output pulses appearing thereon to provide a combined signal having a time-averaged magnitude proportional to the phase difference between the two said input signals.

3. Apparatus according to claim 2 wherein each pulse distributor is an $n$-stage shift register.

4. Apparatus according to claim 3 wherein each shift register is a recirculating digital shift register having a signal binary "1" recirculating therein.

5. An apparatus as claimed in claim 3, wherein $n = 2$ and wherein each pulse distributor includes a plurality of edge triggered delay flip-flops having, respectively, clock and delay inputs, two complementary outputs, and a feedback connection to the delay input to produce a divide-by-two circuit, a plurality of "Exclusive Or" gates each having an output and two inputs, one input of the gate being connected to an output of one flip-flop and the other gate input being connected to the complementary output of the second flip-flop.

6. Apparatus according to claim 2 wherein each pulse distributor is a Johnson ring counter.

7. Apparatus according to claim 6, wherein the combining means is a capacitor one terminal of which is connected to a point of fixed potential and the other terminal of which is connected to each modulator output via a respective resistor and forms the circuit output point of the apparatus.

8. A method for determining the phase difference between first and second signals, each having a cyclically recurring waveform, over a phase difference range of $n \times 360°$ where $n$ is an integer greater than one, the method comprising the steps of dividing the first and second signals into respective first and second signal groups each of $n$ consecutive waveforms, sequentially determining the phase difference between each of the $n$ waveforms of a first signal group and the correspondingly-positioned waveform in a second signal group, deriving for each respective waveform of the first and second signal groups an output signal proportional to the phase difference between the two waveforms concerned, and combining the derived output signals to provide an output signal having a signal level proportional to the phase difference between said first and second signals.

* * * * *